US012339710B2

(12) United States Patent
Qu et al.

(10) Patent No.: US 12,339,710 B2
(45) Date of Patent: *Jun. 24, 2025

(54) ELECTRONIC DEVICE

(71) Applicant: BEIJING XIAOMI MOBILE SOFTWARE CO., LTD., Beijing (CN)

(72) Inventors: Tongxun Qu, Beijing (CN); Jieming Yang, Beijing (CN); Yuwen Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 200 days.

This patent is subject to a terminal disclaimer.

(21) Appl. No.: 18/213,731

(22) Filed: Jun. 23, 2023

(65) Prior Publication Data

US 2024/0288908 A1 Aug. 29, 2024

(30) Foreign Application Priority Data

Feb. 24, 2023 (CN) .......................... 202310187707.7

(51) Int. Cl.
G06F 1/16 (2006.01)
H04M 1/02 (2006.01)

(52) U.S. Cl.
CPC .......... G06F 1/1656 (2013.01); G06F 1/1616 (2013.01); G06F 1/1652 (2013.01);
(Continued)

(58) Field of Classification Search
CPC .... G06F 1/1656; G06F 1/1616; G06F 1/1652; G06F 1/1637; G06F 1/1635;
(Continued)

(56) References Cited

U.S. PATENT DOCUMENTS 9,736,931 B2 * 8/2017 Eom ...................... H05K 1/028
11,029,788 B2 * 6/2021 Park ...................... G06F 3/0416
(Continued)

FOREIGN PATENT DOCUMENTS

CN 115083291 A 9/2022
EP 2547180 A2 1/2013
(Continued)

OTHER PUBLICATIONS

Japanese Patent Application No. 2023-106913, Office Action dated Feb. 22, 2024, 8 pages.
(Continued)

Primary Examiner — Abhishek M Rathod
(74) Attorney, Agent, or Firm — Cozen O'Connor

(57) ABSTRACT

An electronic device includes: a display screen including an array substrate, the array substrate including a substrate body and a bent part connected with a first side surface of the substrate body, and the bent part being bent towards a non-display side of the display screen; a first support plate connected with the substrate body and cooperating with a part of the substrate body to define a first accommodating cavity, and the bent part being partially located in the first accommodating cavity; and a flexible circuit board arranged in the first accommodating cavity, and connected with and in conduction with the bent part, and the flexible circuit board being at least partially arranged between the substrate body and the bent part.

11 Claims, 3 Drawing Sheets

(52) U.S. Cl.
CPC ....... *H04M 1/0216* (2013.01); *H04M 1/0262* (2013.01); *H04M 1/0268* (2013.01); *H04M 1/0277* (2013.01)

(58) Field of Classification Search
CPC ...... G06F 1/1626; H05K 1/028; H05K 1/147; H05K 1/189; H05K 5/0017; H05K 5/02; H05K 5/0217
See application file for complete search history.

(56) References Cited

U.S. PATENT DOCUMENTS

| | | | |
|---|---|---|---|
| 2013/0016049 A1* | 1/2013 | Eom | G06F 3/0412 345/173 |
| 2014/0240933 A1* | 8/2014 | Lee | G06F 1/1656 29/831 |
| 2017/0170255 A1 | 6/2017 | Ha et al. | |
| 2018/0097275 A1* | 4/2018 | Lee | G06F 1/1635 |
| 2018/0366059 A1 | 12/2018 | Lee et al. | |
| 2019/0067795 A1 | 2/2019 | Shin et al. | |
| 2020/0043382 A1* | 2/2020 | Isa | G06F 1/1626 |
| 2022/0085000 A1 | 3/2022 | Yao et al. | |
| 2022/0248534 A1* | 8/2022 | Shi | H05K 1/028 |

FOREIGN PATENT DOCUMENTS

| | | |
|---|---|---|
| KR | 20030066960 A | 8/2003 |
| KR | 20210092095 A | 7/2021 |

OTHER PUBLICATIONS

Japanese Patent Application No. 2023-106913, English translation of Office Action dated Feb. 22, 2024, 17 pages.

European Patent Application No. 23181617.4, Search and Opinion dated Dec. 20, 2023, 13 pages.

* cited by examiner

ELECTRONIC DEVICE

CROSS-REFERENCE TO RELATED APPLICATION

This application is based on and claims priority to Chinese Patent Application No. 202310187707.7 filed on Feb. 24, 2023, the entire contents of which are incorporated herein by reference for all purposes.

BACKGROUND

With the development of terminal technology in electronic device, the level of intelligence and integration of the device also improves. As the level of intelligence improves, power consumption of the internal modules increases which, in turn, causes increased demand for battery capacity in order to enhance the endurance time of the device.

SUMMARY

The present disclosure relates to a field of terminals, and more particularly to an electronic device.

According to embodiments of the present disclosure, there is provided an electronic device. The electronic device includes: a display screen including an array substrate, the array substrate including a substrate body and a bent part connected with a first side surface of the substrate body, and the bent part being bent towards a non-display side of the display screen; a first support plate connected with the substrate body and cooperating with a part of the substrate body to define a first accommodating cavity, and the bent part being partially located in the first accommodating cavity; and a flexible circuit board arranged in the first accommodating cavity, and connected with and in conduction with the bent part, and the flexible circuit board being at least partially arranged between the substrate body and the bent part.

It is to be understood that both the foregoing general description and the following detailed description are illustrative and explanatory only and are not restrictive of the present disclosure.

BRIEF DESCRIPTION OF DRAWINGS

The accompanying drawings, which are incorporated in and constitute a part of the specification, illustrate embodiments consistent with the present disclosure and serve to explain the principle of the disclosure together with the description.

DETAILED DESCRIPTION

Here, exemplary embodiments will be described in detail, examples of which are shown in the accompanying drawings. When the following description refers to the drawings, unless otherwise indicated, the same numbers in different drawings indicate the same or similar elements. The implementations described in the following exemplary embodiments do not represent all the implementations consistent with the present disclosure. Rather, they are merely examples of devices and methods consistent with some aspects of the present disclosure as detailed in the appended claims.

The terms used in the present disclosure are for the purpose of describing specific embodiments only and are not intended to limit the present disclosure. The singular forms "a", "said" and "the" used in the present disclosure and the appended claims are also intended to include the plural forms, unless the context clearly indicates other meaning. It should also be understood that the term "and/or" as used herein refers to and includes any or all possible combinations of one or more associated listed items.

It should be understood that terms such as "first", "second" and "third" are used herein for the purpose of describing various information, but such information should not be limited to these terms. These terms are only used to distinguish the same type of information from each other. For example, without departing from the scope of the present disclosure, the first information may also be called the second information, and similarly, the second information may also be called the first information. Depending on the context, the word "if" as used herein may be interpreted as "while" or "when" or "in response to determining".

Figure 1:
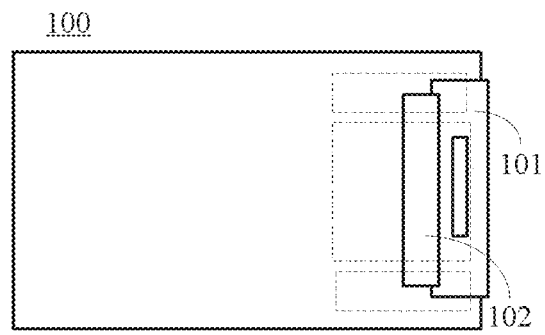
FIG. 1 is prior art and a top view of an electronic device in the related art.
Figure 2:
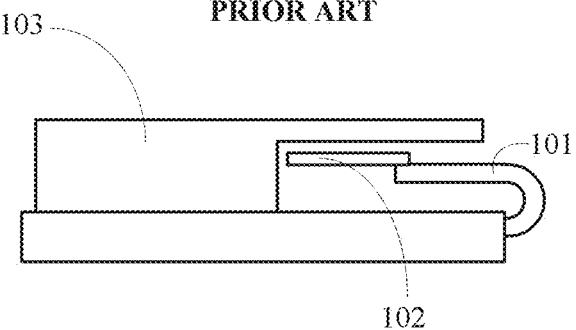
FIG. 2 is prior art and a partial cross-sectional view of the electronic device in FIG. 1.

As shown in FIG. 1 and FIG. 2, in a conventional foldable device 100, a support plate 103 is arranged at one side of a display screen to support the display screen, so as to enhance the strength of the display screen, and a flexible printed circuit (FPC) 102 and a Chip on PI (COP) IC 101 of the screen are arranged under a local portion of the support plate 103. Since the FPC and the COP need to occupy space, and the FPC extends towards the support plate 103 in a horizontal direction in FIG. 2, which needs to occupy a large area, a large region of the display screen cannot be supported by the support plate 103, and the strength of the display screen is weakened.

Figure 3:
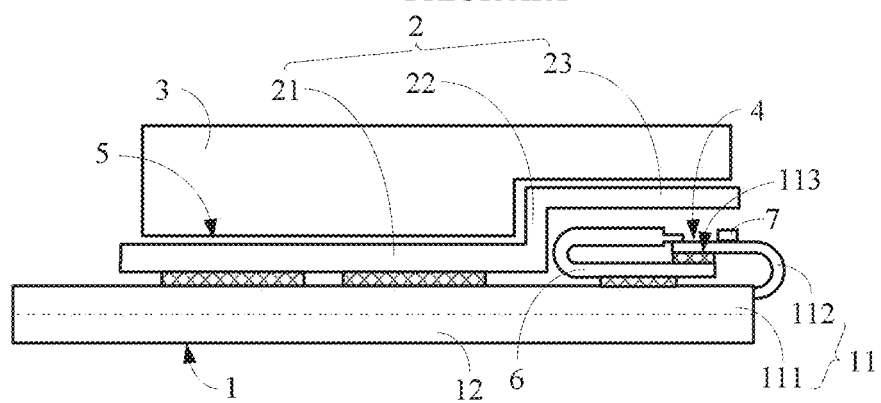
FIG. 3 is a partial cross-sectional view of an electronic device according to an illustrative embodiment.

To this end, as shown in FIG. 3, the present disclosure provides an electronic device 200, and the electronic device 200 may include a display screen 1, a first support plate 2 and a stepped battery 3. The display screen 1 may include an array substrate 11 and a display layer 12, and the display layer 12 is arranged on a surface of the array substrate 11. The array substrate 11 may include a substrate element and a thin film transistor layer, and the substrate element may be a flexible substrate element. The array substrate 11 includes a substrate body 111 and a bent part 112 connected with a first side surface of the substrate body 111. The substrate body 111 may be connected to the display layer 12, and the display layer 12 is supported and protected by the substrate body 111. The bent part 112 is located at an outer side relative to the substrate body 111, so that the bent part 112 may bend towards a non-display side of the display screen 1 and wrap an edge of the first side surface the substrate body 111.

The first support plate 2 is connected with the substrate body 111. Specifically, the first support plate 2 may be connected and fixed with the substrate body 111 by an adhesive, and the first support plate 2 and the substrate body 111 may define an open first accommodating cavity 4. The bent part 112 may extend into the first accommodating cavity 4 after being bent and wrapping the edge (for example, an upper edge in FIGS. 3-7) of the first side surface of the substrate body 111, so that a portion of the bent part 112 may be located in the first accommodating cavity 4.

The electronic device 200 may further include a flexible circuit board 6, which is arranged in the first accommodating cavity 4, and connected with and in conduction with the bent part 112. At least a part of the flexible circuit board 6 may be bonded with the substrate body 111 by an adhesive, and the bent part 112 may be indirectly fixed on the substrate body 111 by the flexible circuit board 6, or the bent part 112 may be directly connected and fixed with the substrate body 111 by an adhesive, which may be designed as required, and is not limited by the present disclosure. An area occupied by the flexible circuit board 6 in the first accommodating cavity 4 will directly affect a volume of the first accommodating cavity 4, and further affect a contact area between the first support plate 2 and the substrate body 111. Therefore, it is also disclosed in the present disclosure that the flexible circuit board 6 may be at least partially arranged between the substrate body 111 and the bent part 112, so that a part of the flexible circuit board 6 may be arranged in a space formed between the bent part 112 and the substrate body 111 when the bent part 112 is bent, without raising higher requirements on the volume of the first accommodating cavity 4, and also, it is beneficial to reducing a size of the flexible circuit board 6 in a horizontal direction in FIG. 3, i.e., reducing a width of the flexible circuit board 6. Therefore, a size of the first accommodating cavity 4 in the horizontal direction of FIG. 3 can be reduced, without increasing a size of the first accommodating cavity 4 in a vertical direction of FIG. 3, so that the overall volume of the first accommodating cavity 4 is reduced, which is beneficial to increasing the contact area between the first support plate 2 and the display screen 1, thereby improving the strength of the display screen 1.

According to the current development trend, in order to occupy a favorable market, major manufacturers are considering upgrading the configuration of mainstream flagship models, so it is necessary to configure more and larger components inside the device, which loses the thickness advantage of the device. In particular, for the current mainstream foldable models, due to the large screen, the power consumption is significantly increased, so that, in order to improve the endurance capacity of the foldable device, it is necessary to configure a relatively thick and heavy battery in the device. As shown in FIG. 1 and FIG. 2, the battery is arranged above the support plate 103, and its side adjacent to the support plate 103 is flat, so that the space utilization rate is not good, and the battery capacity cannot be optimized to a greater extent to improve the endurance capacity of the device.

Therefore, as shown in FIG. 3, the first support plate 2 may include a support body 21, a transition part 22 and a step part 23. One end of the transition part 22 is connected with the support body 21 and the other end of the transition part 22 is connected with the step part 23. The support body 21 and the step part 23 are spaced apart from each other by a preset distance in a thickness direction of the electronic device 200, and the preset distance is equal to a height of the transition part 22 in the thickness direction of the electronic device 200. The support body 21 may be connected to a second side surface (which is connected with and perpendicular to the first side surface) of the substrate body 111 facing away from the display layer 12, for example, bonded to the substrate body 111 by a double-sided adhesive tape, and the strength of the display screen 1 is further improved by the support body 21. A side surface of the transition part 22, a side surface of the step part 23 and a part of the substrate body 111 may define the first accommodating cavity 4, and the bent part 112 may extend into the first accommodating cavity 4 after being bent and wrapping the edge of the first side surface of the substrate body 111, so that the portion of the bent part 112 may be located in the first accommodating cavity 4. Further, since the transition part 22 extends along the thickness direction of the electronic device 200, the support body 21 and the step part 23 have a height difference therebetween, so that another opposite side surface of the transition part 22, another opposite side surface of the step part 23 and the support body 21 may cooperate to define a second accommodating cavity 5, and the stepped battery 3 may be arranged on a side surface of the first support plate 2 facing away from the display screen 1, and partially arranged in the second accommodating cavity 5.

Based on this consideration, since the stepped battery 3 may be partially arranged in the second accommodating cavity 5, the volume of the stepped battery 3 can be increased, the capacity of the stepped battery 3 can be improved, and the endurance time of the electronic device 200 can be prolonged. In the present disclosure, an example in which no frames are arranged on both sides of the second accommodating cavity 5 is taken. In fact, in other embodiments, the second accommodating cavity 5 may also have a shape of a groove, and this is not limited in the present disclosure. In particular, through the solutions in the embodiments shown in FIGS. 3 and 5, after decreasing the width of the flexible circuit board 6 and the volume of the first accommodating cavity 4, the transition part 22 of the first support plate 2 can be arranged more adjacent to the bent part 112, so that the volume of the second accommodating cavity 5 can be increased, which is beneficial to further improving the capacity of the stepped battery 3.

The part of the flexible circuit board 6 arranged between the substrate body 111 and the bent part 112 may be realized in various ways.

In an embodiment, also as shown in FIG. 3, the bent part 112 may include a first electrical connection region 113, which is located at a side of the bent part 112 facing away from the substrate body 111. The flexible circuit board 6 has a monolithic design, and may wrap an edge of the bent part 112 and be folded into a space between the substrate body 111 and the bent part 112, thereby reducing the width of the flexible circuit board 6 in the horizontal direction in FIG. 3 and facilitating the increase of the volume of the second accommodating cavity 5. A part of the flexible circuit board 6 bent into the space between the substrate body 111 and the bent part 112 may be bonded with the substrate body 111 at a side surface facing the substrate body 111 by a double-sided adhesive tape, and its another side surface (i.e. another side surface of the part of the flexible circuit board 6 bent into the space between the substrate body 111 and the bent part 112) facing away from the substrate body 111 may be bonded and fixed with the bent part 112. Of course, the bent part 112 may also be directly bonded to the substrate body 111 by a double-sided adhesive tape and a spacer.

Figure 4:
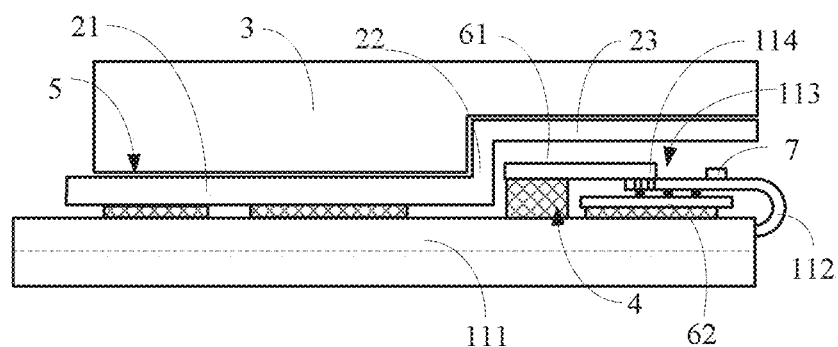
FIG. 4 is a partial cross-sectional view of a further electronic device according to an illustrative embodiment.

In another embodiment, as shown in FIG. 4, the bent part 112 may include a first electrical connection region 113, which is located at a side of the bent part 112 facing away from the substrate body 111, and the bent part 112 may further include a conductive via hole 114. The flexible circuit board 6 may include a first circuit board 61 and a second circuit board 62. The first circuit board 61 is arranged above the bent part 112, and is connected with and in conduction with the first electrical connection region 113. The second circuit board 62 is at least partially located between the substrate body 111 and the bent part 112, and may be in conduction with the first electrical connection region 113 through the conductive via hole 114. Based on this, on the one hand, the space can be made for the transition part 22 to increase the volume of the second accommodating cavity 5, and on the other hand, compared with the embodiment shown in FIG. 3, the flexible circuit board 6 can be avoided from being bent, which is beneficial to prolonging the service life. The first circuit board 61 and the second circuit board 62 may be bonded to the substrate body 111 by adhesives, respectively.

Figure 5:
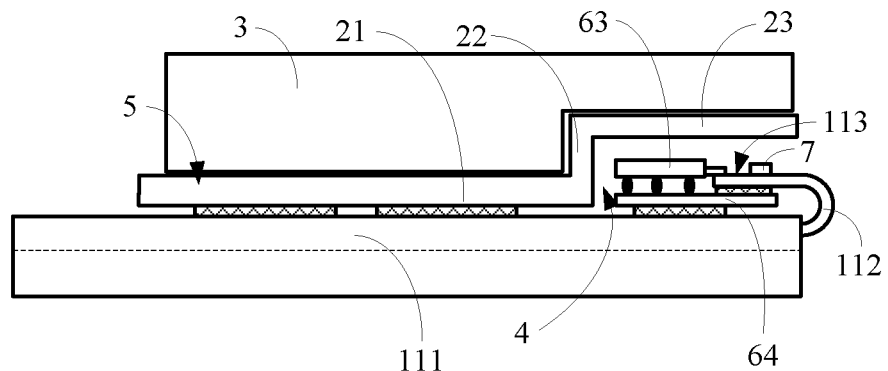
FIG. 5 is a partial cross-sectional view of another electronic device according to an illustrative embodiment.

In another embodiment, as shown in FIG. 5, the bent part 112 may include a first electrical connection region 113, which is located at a side of the bent part 112 facing away from the substrate body 111, the flexible circuit board 6 may include a third circuit board 63 and a fourth circuit board 64, the third circuit board 63 is connected with and in conduction with the first electrical connection region 113, the third circuit board 63 is in conduction with the fourth circuit board 64, and the fourth circuit board 64 is at least partially located between the substrate body 111 and the bent part 112. Based on this, on one hand, the circuit board can be avoided from being bent, which is beneficial to prolonging the service life; on the other hand, there is no need to form a hole in the bent part 112, which improves the strength of the bent part 112. One side surface of the fourth circuit board 64 is bonded to the substrate body 111 by a double-sided adhesive tape, and the other opposite side surface of the fourth circuit board 64 is bonded to the bent part 112 by a double-sided adhesive tape.

Figure 6:
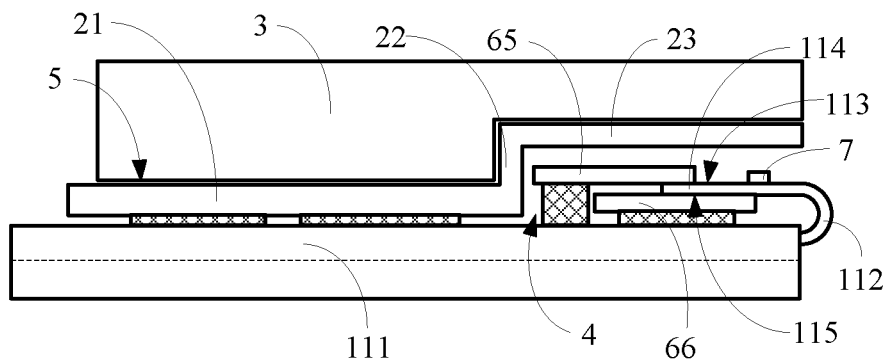
FIG. 6 is a partial cross-sectional view of still another electronic device according to an illustrative embodiment.

In a further embodiment, as shown in FIG. 6, the bent part 112 may include a first electrical connection region 113 and a second electrical connection region 115, the first electrical connection region 113 is located at a side of the bent part 112 facing away from the substrate body 111, and the second electrical connection region 115 is located at a side of the bent part 112 facing the substrate body 111. In other words, the first electrical connection region 113 and the second electrical connection region 115 are oppositely arranged. The flexible circuit board 6 may include a fifth circuit board 65 and a sixth circuit board 66, the fifth circuit board 65 is connected with and in conduction with the first electrical connection region 113, and is at least partially located at the side of the bent part 112 facing away from the substrate body 111 (i.e. at least partially arranged between the bent part 112 and the step part 23), and the sixth circuit board 66 is connected with and in conduction with the second electrical connection region 115, and is at least partially arranged between the substrate body 111 and the bent part 112. Based on this, on one hand, the circuit board can be prevented from being bent, which is beneficial to prolonging the service life; on the other hand, there is no need to form a hole in the bent part 112, which improves the strength of the bent part 112. The fifth circuit board 65 and the sixth circuit board 66 may be bonded to the substrate body 111 by double-sided adhesive tapes, respectively.

Figure 7:
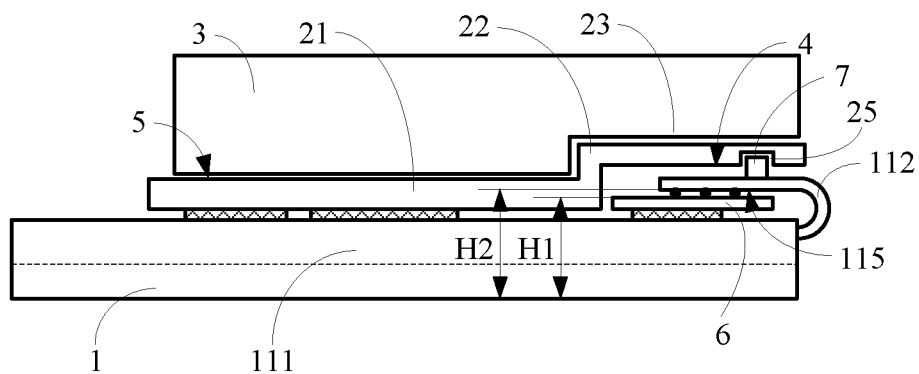
FIG. 7 is a partial cross-sectional view of yet another electronic device according to an illustrative embodiment.

In another embodiment, as shown in FIG. 7, the bent part 112 may include a second connection region 115, which is located at a side of the bent part 112 facing the substrate body 111. The flexible circuit board 6 has a monolithic structure, and is at least partially arranged between the substrate body 111 and the bent part 112, and a region of the flexible circuit board 6 arranged between the substrate body 111 and the bent part 112 is connected with and in conduction with the second electrical connection region 115. In this way, the space can be made for the transition part 22 by the monolithic flexible circuit board 6, and also the monolithic flexible circuit board 6 is connected with and in conduction with the bent part 112, which can reduce the connection and conduction between the circuit boards.

Based on the embodiment shown in FIG. 7, in a case, a circuit board may be arranged at a side of the bent part 112 facing away from the substrate body 111, and this circuit board may be in conduction with the second electrical connection region 115 or the circuit board between the substrate body 111 and the bent part 112. In another case, in the thickness direction of the electronic device 200, i.e., in a vertical direction of FIG. 7, relative to the substrate body 111, the maximum height H1 of the flexible circuit board 6 is lower than the minimum height H2 of the bent part 112, i.e., H1<H2. In other words, the whole flexible circuit board 6 is arranged between the substrate body 111 and the bent part 112, so that the volume of the first accommodating cavity 4 can be reduced, and hence the space can be made for the step part 23, which is also beneficial to improving the capacity of the stepped battery 3.

In the above embodiments, an example in which a single-layer flexible circuit board is arranged between the substrate body 111 and the bent part 112 is taken. In fact, in other embodiments, if the space permits, a plurality of circuit boards may be stacked between the substrate body 111 and the bent part 112, or the same circuit board may be bent many times, which is not limited by the present disclosure.

Also as shown in FIG. 7, the first support plate 2 may further include a second avoidance part 25 in communication with the first accommodating cavity 4, for example, the second avoidance part 25 may be arranged on the step part 23, the electronic device 200 may further include a chip assembly 7, the chip assembly 7 may be arranged on the surface of the bent part 112 facing away from the substrate body 111, and the related signals of the display screen 1 may be output through the chip assembly 7. Moreover, in order to protect the chip assembly 7, the chip assembly 7 may be at least partially located in the second avoidance part 25, which can reduce an impact on the chip assembly 7 when an external force is exerted. Of course, if there is another structural member between the first support plate 2 and the chip assembly 7, such as an insulating cover, a corresponding through groove may be formed in the structural member.

Figure 8:
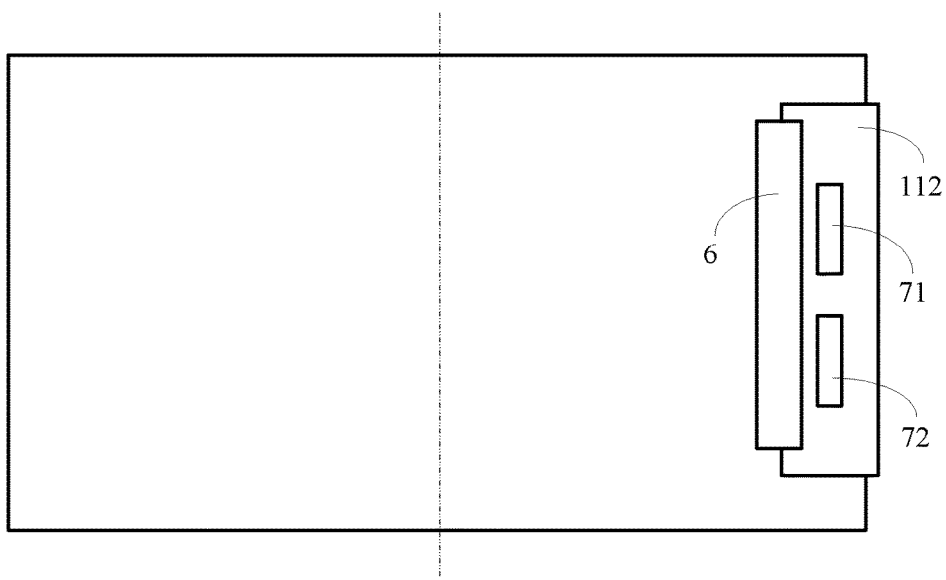
FIG. 8 is a top view of an electronic device according to an illustrative embodiment.

The chip assembly 7 may include a single chip, or as shown in FIG. 8, the chip assembly 7 may include a first chip 71 and a second chip 72, both of which are arranged in the region of the bent part 112 parallel to the substrate body 111, and are in conduction with the bent part 112, respectively. Through the first chip 71 and the second chip 72, the related signals of the thin film transistor layer of the display screen 1 can be collected and further output through the flexible circuit board 6. Compared with a single chip in the related art, arranging two chips can reduce the requirements on the processing resources of the chips. In combination with the embodiment of FIG. 7, at least one of the first chip 71 and the second chip 72 may be arranged in the second avoidance part 25 of the first support plate 2.

As also shown in FIG. 8, the first chip 71 and the second chip 72 may be symmetrically arranged with respect to a center line of the bent part 112, and an extension direction of the center line is perpendicular to the first side surface (specifically, the edge of the first side surface), which is vertically arranged in FIG. 8, so that the center line of the bent part 112 is horizontally arranged in FIG. 8. By symmetrically arranging the first chip 71 and the second chip 72, it is convenient for the signals output by the thin film transistor layer to be shunted by the two chips, and the electrical connection between the two chips and the bent part 112 can also be simplified.

Figure 9:
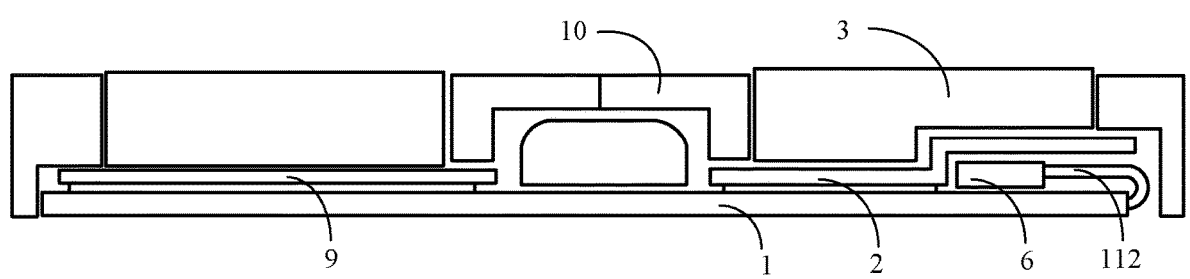
FIG. 9 is a cross-sectional view of an electronic device according to an illustrative embodiment.

Based on the above embodiments, the electronic device 200 may be a device with the screen on a single side, or as shown in FIG. 9, the electronic device 200 may be a foldable device. The electronic device 200 may also include a second support plate 9 and a rotating shaft 10, the second support plate 9 is connected to the second side surface of the substrate body 111 facing away from the display layer 12, the second support plate 9 is also connected to one side of the rotating shaft 10, and the first support plate 2 is connected to the other side of the rotating shaft 10. Subsequently, the second support plate 9 and the first support plate 2 can move close to each other or away from each other through the rotation of the rotating shaft 302, so that the electronic device 200 can be switched between a folded state and an unfolded state.

In the above embodiments, the bent part 112 is bent to wrap the edge of the first side surface of the substrate body 111 adjacent to the first support plate 2, and the second support plate 9 is arranged in a flat shape. In fact, in other embodiments, the related circuits of the array substrate 11 may also be led out from a side where the second support plate 9 is, and similarly, a bent part may also be provided. The subsequent battery arrangement and the subsequent related circuit board arrangement on the side corresponding to the second support plate 9 may refer to the previous embodiments, and will not be described in detail here.

Other embodiments of the present disclosure will easily occur to those skilled in the art after considering the specification and practicing the disclosure disclosed herein. The present disclosure is intended to cover any variations, uses or adaptations of the present disclosure, which follow the general principle of the present disclosure and include the common sense or common technical means in the related art that are not disclosed in the present disclosure. The specification and embodiments are to be regarded as illustrative only, while the true scope and spirit of the present disclosure are indicated by the following claims.

It should be understood that the present disclosure is not limited to the precise structure described above and shown in the drawings, and various modifications and changes can be made without departing from the scope of the present disclosure. The scope of the present disclosure is limited only by the appended claims.

What is claimed is:

1. An electronic device, comprising: a display screen comprising an array substrate, the array substrate comprising a substrate body and a bent part connected with a first side surface of the substrate body, and the bent part being bent towards a non-display side of the display screen;
   a first support plate connected with the substrate body and cooperating with a part of the substrate body to define a first accommodating cavity, and the bent part being partially located in the first accommodating cavity; and
   a flexible circuit board arranged in the first accommodating cavity, and connected with and in conduction with the bent part, and the flexible circuit board being at least partially arranged between the substrate body and the bent part;
   the first support plate comprises a support body, a transition part and a step part, the transition part connects the support body with the step part, and the support body and the step part are spaced apart by a preset height in a thickness direction of the electronic device; and the support body is connected with the substrate body, wherein one side surface of the step part, one side surface of the transition part and the corresponding part of the substrate body define the first accommodating cavity, and the other opposite side surface of the step part, the other opposite side surface of the transition part and the support body define a second accommodating cavity;
   wherein the electronic device further comprises a stepped battery arranged on a side surface of the first support plate facing away from a display side of the display screen, and the stepped battery is partially arranged in the second accommodating cavity;
   the flexible circuit board comprises two separate circuit boards arranged at two sides of the bent part, respectively, a first circuit board of the two separate circuit boards is in conduction with the bent part, and a second circuit board of the two separate circuit boards is in conduction with the bent part or the first circuit board.

2. The electronic device according to claim 1, wherein the bent part comprises a first electrical connection region, and the first electrical connection region is located at a side of the bent part facing away from the substrate body; and
   the flexible circuit board is connected with the first electrical connection region, extends away from the bent part, wraps an edge of the bent part and is folded into a space between the substrate body and the bent part.

3. The electronic device according to claim 1, wherein the bent part comprises a first electrical connection region, the first electrical connection region is located at a side of the bent part facing away from the substrate body, and the bent part comprises a conductive via hole;
   the flexible circuit board comprises the first circuit board and the second circuit board, and the first circuit board is in conduction with the first electrical connection region; and the second circuit board is at least partially located between the substrate body and the bent part, and is in conduction with the first electrical connection region through the conductive via hole.

4. The electronic device according to claim 1, wherein the bent part comprises a first electrical connection region, and the first electrical connection region is located at a side of the bent part facing away from the substrate body; and the flexible circuit board comprises the first circuit board and the second circuit board, the first circuit board is connected with and in conduction with the first electrical connection region, the second circuit board is connected with and in conduction with the first circuit board, and the second circuit board is at least partially located between the substrate body and the bent part.

5. The electronic device according to claim 1, wherein the bent part comprises a first electrical connection region and a second electrical connection region, the first electrical connection region is located at a side of the bent part facing away from the substrate body, and the second electrical connection region is located at a side of the bent part facing the substrate body; and
   the flexible circuit board comprises the first circuit board and the second circuit board, the first circuit board being connected with and in conduction with the first electrical connection region, the second circuit board being connected with and in conduction with the second electrical connection region, wherein the sixth circuit board is at least partially located between the substrate body and the bent part.

6. The electronic device according to claim 1, wherein the bent part comprises a second electrical connection region, and the second electrical connection region is located at a side of the bent part facing the substrate body; and
   a region of the flexible circuit board arranged between the substrate body and the bent part is in conduction with the second electrical connection region.

7. The electronic device according to claim 6, wherein in a thickness direction of the electronic device, relative to the substrate body, a maximum height of the flexible circuit board is lower than a minimum height of the bent part.

8. The electronic device according to claim 1, wherein the first support plate comprises a second avoidance part in communication with the first accommodating cavity; and
   the electronic device further comprises a chip assembly, the chip assembly is arranged on a surface of the bent part facing away from the substrate body, and the chip assembly is at least partially located in the second avoidance part.

9. The electronic device according to claim 1, wherein the electronic device further comprises a chip assembly, the chip assembly comprising a first chip and a second chip, wherein both the first chip and the second chip are arranged on a portion of the bent part parallel to the substrate body.

10. The electronic device according to claim 9, wherein the first chip and the second chip are symmetrically arranged relative to a center line of the bent part, and an extension direction of the center line is perpendicular to the first side surface.

11. The electronic device according to claim 1, further comprising:
    a second support plate connected with the substrate body; and
    a rotating shaft,
    wherein the second support plate is connected to one side of the rotating shaft, and the first support plate is connected to the other side of the rotating shaft; and
    the second support plate and the first support plate are configured to move close to or away from each other along with rotation of the rotating shaft, to allow the electronic device to be switched between an unfolded state and a folded state.

* * * * *